(12) United States Patent
Kulkarni et al.

(10) Patent No.: US 11,206,036 B2
(45) Date of Patent: Dec. 21, 2021

(54) INTEGRATED SELF-TEST MECHANISM FOR AN ANALOG-TO-DIGITAL CONVERTER, A REFERENCE VOLTAGE SOURCE, A LOW DROPOUT REGULATOR, OR A POWER SUPPLY

(71) Applicant: TEXAS INSTRUMENTS INCORPORATED, Dallas, TX (US)

(72) Inventors: Rahul Vijay Kulkarni, Bengaluru (IN); Abhijeet Gopal Godbole, Solapur (IN); Shridhar Atmaram More, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 118 days.

(21) Appl. No.: 16/709,809

(22) Filed: Dec. 10, 2019

(65) Prior Publication Data

US 2020/0186160 A1 Jun. 11, 2020

(30) Foreign Application Priority Data

Dec. 11, 2018 (IN) .............................. 201841046805

(51) Int. Cl.
*H03M 1/10* (2006.01)
*G01R 31/40* (2020.01)
*H03K 5/24* (2006.01)

(52) U.S. Cl.
CPC .......... *H03M 1/1071* (2013.01); *G01R 31/40* (2013.01); *H03K 5/24* (2013.01)

(58) Field of Classification Search
CPC .... H03M 1/1071; H03M 1/122; G01R 31/40; H03K 5/24
See application file for complete search history.

(56) References Cited

U.S. PATENT DOCUMENTS

| 9,823,282 | B2 * | 11/2017 | Narayanan | ......... G01R 31/3181 |
| 2005/0248477 | A1 * | 11/2005 | Jongsma | ............. H03M 1/1076 341/110 |

(Continued)

*Primary Examiner* — Dominic E Hawkins
(74) *Attorney, Agent, or Firm* — John R. Pessetto; Charles A. Brill; Frank D. Cimino

(57) ABSTRACT

An integrated self-test mechanism for monitoring an analog-to-digital converter (ADC), a reference voltage ($V_{ref}$) source associated with the ADC, a low-dropout regulator (LDO), or a power supply is provided. In one example, an ADC that is associated with an integrated circuit (IC) can monitor its own $V_{ref}$, the voltage ($V_{LDO}$) of an LDO associated with the IC, or the voltage (AVDD) provided to an electrical coupling mechanism in the IC that is coupled to a power supply associated with the IC. The ADC can generate a digital output code based, at least in part, on the $V_{ref}$ and one or more of the $V_{LDO}$ and the AVDD. The digital output code can be used to determine whether one or more of the ADC, the $V_{ref}$ source, the LDO, and the power supply is malfunctioning or nonoperational.

7 Claims, 3 Drawing Sheets

(56) References Cited

U.S. PATENT DOCUMENTS

| | | | | |
|---|---|---|---|---|
| 2007/0046271 | A1* | 3/2007 | Zolfaghari | G05F 1/575 323/274 |
| 2012/0126781 | A1* | 5/2012 | Narayanan | G01R 31/3004 324/76.11 |
| 2015/0276529 | A1* | 10/2015 | Wiesbauer | G01L 9/085 73/724 |
| 2016/0084914 | A1* | 3/2016 | Bernardon | H01M 10/425 324/430 |

* cited by examiner

INTEGRATED SELF-TEST MECHANISM FOR AN ANALOG-TO-DIGITAL CONVERTER, A REFERENCE VOLTAGE SOURCE, A LOW DROPOUT REGULATOR, OR A POWER SUPPLY

CROSS-REFERENCE TO RELATED APPLICATIONS

This application claims priority to Indian Provisional Application No. 201841046805, filed Dec. 11, 2018, which is hereby incorporated by reference.

BACKGROUND

In an electronic system, such as an automotive or an industrial electronic system, one or more signals are measured to ensure that one or more circuits within the electronic system are functioning properly. Such circuits include a sensor circuit, a power supply circuit, or any other circuit that has voltages or currents that affect or are crucial to the electronic system's operation.

An analog-to-digital converter (ADC) can be used to monitor the signals that indicate the operational state(s) of the circuit(s) within an electronic system. In some scenarios, the ADC may malfunction or become nonoperational. For example, a reference voltage ($V_{ref}$) associated with the ADC may change to an undesirable magnitude—that is, the $V_{ref}$ becomes improper. Consequently, the ADC itself may need to be monitored or tested to ensure that it is operating correctly.

Generally, an ADC is provided with a $V_{ref}$ by a $V_{ref}$ source. In some scenarios, the $V_{ref}$ source may malfunction or become nonoperational. For example, a reference voltage ($V_{ref}$) associated with the ADC may change to an undesirable magnitude—that is, the $V_{ref}$ becomes improper. Consequently, the $V_{ref}$ source itself may need to be monitored or tested to ensure that it is operating correctly.

An electronic system may also include a low-dropout regulator (LDO) for regulating an operating or core voltage associated with a component of the electronic system (e.g., an ADC, etc.). The LDO may malfunction or become nonoperational. For example, a voltage ($V_{LDO}$) associated with the LDO may change to an undesirable magnitude—that is, the $V_{LDO}$ becomes improper. Consequently, the LDO itself may need to be monitored or tested to ensure that it is operating correctly.

Moreover, an electronic system may be associated with a power supply (e.g., an internal power supply, an external power supply, etc.). The power supply may malfunction or become nonoperational. For example, a voltage (AVDD) associated with the power may change to an undesirable magnitude—that is, the AVDD becomes improper. Consequently, the power supply itself may need to be monitored or tested to ensure that it is operating correctly.

SUMMARY

The examples provided below enable monitoring an analog-to-digital converter (ADC) associated with an integrated circuit (IC), a reference voltage ($V_{ref}$) source associated with the ADC, a low-dropout regulator (LDO) associated with the IC, or a power supply associated with the IC without the use of additional components (e.g., an auxiliary ADC, etc.) that are external to the IC. More specifically, an ADC that is associated with an IC can monitor its own $V_{ref}$, a voltage ($V_{LDO}$) of an LDO associated with the IC, or a voltage (AVDD) provided by a power supply that is associated with the IC. In this way, the IC can include an integrated self-test mechanism for indicating a malfunction or nonoperation of the ADC, the $V_{ref}$ source, the LDO, or the power supply.

In one example, an IC comprises an ADC, a $V_{ref}$ source coupled to the ADC, a multiplexer (MUX) coupled to the ADC, and an LDO coupled to the ADC and the MUX. The ADC is configured to generate an N-bit digital output code based, at least in part, on one or more analog signals. N is an integer that represents a resolution of the ADC. The $V_{ref}$ source is configured to generate a $V_{ref}$ for the ADC. The MUX is configured to communicate one or more first analog signals to the ADC. The LDO is configured to communicate a second analog signal that is representative of a $V_{LDO}$ to the MUX. The ADC may be further configured to receive the one or more first analog signals and the second analog signal from the MUX and generate the N-bit digital output code based, at least in part, on two or more of: (i) the first one or more analog signals; (ii) the second analog signal; and (iii) the $V_{ref}$. The IC may also include a comparator (e.g., a digital comparator, etc.) coupled to the ADC. The comparator is configured to compare the generated N-bit digital output code to one or more additional digital output codes to assist with or enable determining whether one or more of the ADC, the $V_{ref}$ source, and the LDO is malfunctioning or nonoperational.

In another example, an IC comprises an ADC, a $V_{ref}$ source coupled to the ADC, a MUX coupled to the ADC, and an electrical coupling mechanism coupled to the ADC and the MUX. The ADC is configured to convert one or more analog signals into an N-bit digital output code. N is an integer that represents a resolution of the ADC. The $V_{ref}$ source is configured to generate a $V_{ref}$ for the ADC. The MUX is configured to communicate one or more first analog signals to the ADC. The electrical coupling mechanism is configured to couple with a power supply and to communicate a second analog signal that is representative of a voltage (AVDD) associated with the power supply to the MUX. The ADC may be further configured to receive the one or more first analog signals and the second analog signal from the MUX and generate the N-bit digital output code based, at least in part, on two or more of: (i) the first one or more analog signals; (ii) the second analog signal; and (iii) the $V_{ref}$. The IC may also include a comparator (e.g., a digital comparator, etc.) coupled to the ADC. The comparator is configured to compare the N-bit digital output code to one or more additional digital output codes to assist with or enable determining whether one or more of the ADC, the power supply, and the $V_{ref}$ source is malfunctioning or nonoperational.

The examples described above and one or more other examples are evident from the FIGS. and the description provided below in connection with the FIGS.

BRIEF DESCRIPTION OF THE DRAWINGS

For a detailed description of various examples, reference will now be made to the accompanying drawings in which.

DETAILED DESCRIPTION

Figure 1:
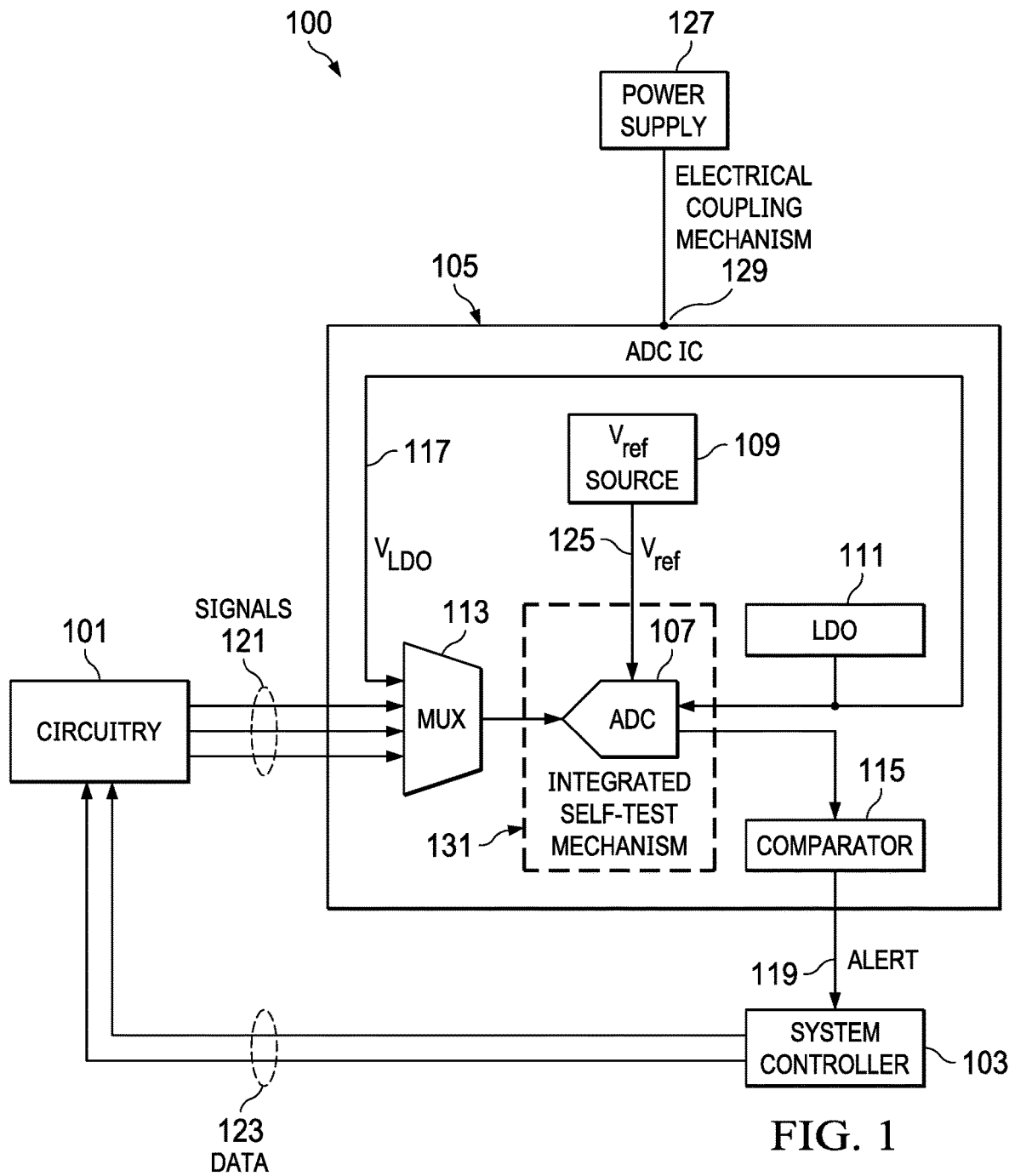
FIG. 1 is an illustration of an example electronic system comprising circuitry to be monitored, an analog-to-digital converter (ADC), a low-dropout regulator (LDO), a reference voltage ($V_{ref}$) source, and an integrated self-test mechanism for the ADC, the $V_{ref}$ source, and the LDO.

The examples described herein pertain to one or more electronic systems (e.g., automotive electronic systems, industrial electronic systems, etc.) that include at least an analog-to-digital converter (ADC). In an example electronic system, an ADC can be used to acquire one or more signals for determining whether circuitry of the example electronic system is operating properly. Such circuitry includes sensor circuitry, power supply circuitry, or any other circuitry that has voltages or currents that affect or are crucial to the electronic system's operation. One problem that plagues such electronic systems is determining whether the ADC is malfunctioning or nonoperational. Generally determining whether an ADC is operating properly includes monitoring the ADC's reference voltage ($V_{ref}$) to determine whether it has changed to an undesirable magnitude—that is, whether the $V_{ref}$ has become improper. In at least one currently electronic system, an auxiliary ADC is used to monitor the main ADC (i.e., the ADC that is used to monitor the electronic system's circuitry) to determine whether the main ADC is operating properly. More specifically, the $V_{ref}$ of the main ADC is fed into the auxiliary ADC and used by the auxiliary ADC to generate a digital output code that is analyzed to determine whether the main ADC is operating properly. One drawback associated with using an auxiliary ADC is that the technique requires the main ADC to monitor the $V_{ref}$ of the auxiliary ADC to determine whether the auxiliary ADC is operating properly. Consequently, an extra channel must be added to the main ADC to feed the auxiliary ADC's $V_{ref}$ into the main ADC, which then generates a digital output code that is analyzed to determine whether the auxiliary ADC is operating properly.

The currently available technique described above is suboptimal. This is because it requires using an additional ADC (e.g., an auxiliary ADC, etc.), an additional channel in the main ADC, and an additional voltage (e.g., the auxiliary ADC's $V_{ref}$, etc.). These additions are not necessary to operating the circuitry being monitored by the main ADC. The currently available technique is also suboptimal because it requires multiple monitoring and processing operations to monitor the main ADC. The additional ADC, channel, voltage, monitoring operations, and processing operations create added costs and complexities to manufacturing, maintaining, and operating an electronic system that comprises the main ADC. These costs and complexities may undesirably increase one or more failure rates associated with the electronic system.

The examples described herein resolve one or more of the shortcomings described above. This is at least because the examples described herein are directed to an integrated self-test mechanism for an ADC being used to monitor an electronic system's circuitry. As a result, the example described herein do away with using the additional ADC, channel, voltage, monitoring operations, and processing operations to monitor the ADC. In one example, an integrated circuit (IC), such as a multi-channel ADC IC, comprises an ADC, a low-dropout regulator (LDO), a $V_{ref}$ source, and a multiplexer (MUX). In this scenario, the ADC receives one or more first analog signals from circuitry being monitored via the MUX and a second analog signal that is representative of the LDO's voltage ($V_{LDO}$) from the LDO. The ADC uses one or more of the received signals and its $V_{ref}$ to generate a digital output code that can be analyzed to determine whether one or more of the ADC, the $V_{ref}$ source, and the LDO is malfunctioning. In this way, the IC includes an integrated self-test mechanism for monitoring the ADC, the $V_{ref}$ source, and the LDO.

In another example, an IC, such as a multi-channel ADC IC, comprises an ADC, an electrical coupling mechanism coupled to a power supply, a $V_{ref}$ source, and a MUX. In this example, the ADC receives one or more first analog signals from circuitry being monitored via the MUX and a second analog signal that is representative of the power supply's voltage via the electrical coupling mechanism. The ADC uses one or more of the received signals and its $V_{ref}$ to generate a digital output code that can be analyzed to determine whether one or more of the ADC, the $V_{ref}$ source, the power supply is malfunctioning. In this way, the IC includes a self-test mechanism for monitoring the ADC, the $V_{ref}$ source, and the power supply.

FIG. 1 is an illustration of an example electronic system 100 comprising circuitry 101, an ADC 107, a $V_{ref}$ source 109, an LDO 111, and an integrated self-test mechanism 131 for the ADC 107, the $V_{ref}$ source 109, and the LDO 111. As shown, the electronic system 100 includes circuitry 101 to be monitored, a power supply 127, an ADC IC 105, and a system controller 103.

The electronic system 100 can be any type of electronic system that includes circuitry with voltages or currents that can be monitored by an ADC (e.g., ADC 107, etc.). For example, the electronic system 100 can be an automotive electronic system, an industrial electronic system, an aeronautical electronic system, or any other type of electronic system that includes circuitry with voltages or currents that can be monitored by an ADC (e.g., ADC 107, etc.).

The system controller 103 of the electronic system 100 can be any type of IC configured to control or direct the operation of the circuitry 101. For example, the system controller 103 can communicated data 123 to the circuitry 101 to cause the circuitry 101 to trigger, adjust, or terminate one or more of the circuitry 101's operating conditions or states.

The circuitry 101 of the electronic system can, for example, be sensor circuitry, power supply circuitry, or any other type of circuitry with voltages or currents that can be monitored by an ADC (e.g., ADC 107, etc.). The circuitry 101 is monitored by the ADC IC 105. For example, and as shown in FIG. 1, one or more signals 121 (e.g., one or more analog signals, etc.) generated by or associated with the circuitry 101 are provided to the ADC IC 105. The ADC IC 105 processes the one or more signals 121 and may generate an output (e.g., alert 119, etc.) that can be provided to the system controller 103. The system controller 103 may process the output (e.g., alert 119, etc.) of the ADC IC 105 and generate data 123 to be communicated to the circuitry 101. For example, based on the ADC IC 105 monitoring the circuitry 101 via the one or more signals 121, the ADC IC 105 can determine that one or more operating conditions or states of the circuitry 101 need to be adjusted. For this example, the ADC IC 105 can communicate its determination in the form of alert 119 to the system controller 103. Furthermore, and for this example, the system controller 103 can process alert 119 and generate data 123 that is communicated to the circuitry 101 to cause the circuitry 101 to adjust one or more of its operating conditions or states.

The power supply 127 can be any power supply capable of providing power to ADC IC 105 or one or more of the components in the electronic system 100. For example, and as shown in FIG. 1, the power supply 127, which is coupled to the ADC IC 105 via an electrical coupling mechanism 129, is configured to supply power to one or more components in or associated with the ADC IC 105 (e.g., the ADC 107, the MUX 113, the LDO 111, the $V_{ref}$ source 109, the comparator 115, etc.). In the preceding example, the power supply 125 can provide power to the one or more components in or associated with the ADC IC 105, however, other configurations are possible. For example, the power supply 127 can be configured to provide power to one or more of: (i) the ADC IC 105 itself; (ii) one or more other components, devices, or systems associated with or in the ADC IC 105 (including one or more components that are not shown in FIG. 1); (iii) the system controller 103 itself; (iv) one or more components, devices, or systems associated with or in the system controller 103 (including one or more components that are not shown in FIG. 1); (v) the circuitry 101 itself; (vi) one or more components, devices, or systems associated with or in the circuitry 101 (including one or more components that are not shown in FIG. 1); (vii) the electronic system 100 itself; and (viii) components, devices, or systems associated with or in the electronic system 100 (including one or more components, devices, or systems that are not shown in FIG. 1).

The electrical coupling mechanism 129 mentioned above can be a lead, a pin, a pad, any combination thereof, or any other coupling mechanism or combination of coupling mechanisms that can be used to couple the ADC IC 105 to a device, component, or system that is external to the ADC IC 105. In one scenario, a wire or a suitable equivalent couples the electrical coupling mechanism 129 (e.g., a lead, a pad, a pin, etc.) to the power supply 127. For example, the electrical coupling mechanism 129 is coupled via a wire or suitable equivalent to one or more terminals of or associated with the power supply 127.

The ADC IC 105 includes an ADC 107, a $V_{ref}$ source 109, an LDO 111, a MUX 113, and a comparator 115. In one example, the MUX 113 can be any type of MUX capable of receiving one or more signals 121 from the circuitry 101 and from other components (e.g., the ADC 107, the $V_{ref}$ source 109, the LDO 111, the comparator 115, etc.).

The LDO 111 can be any type of low-dropout regulator configured to regulate a core voltage of the ADC 107. The $V_{ref}$ source 109 generates a $V_{ref}$ 125, which is associated with (e.g., provided to, etc.) the ADC 107. The $V_{ref}$ can have any value (e.g., 1 volt (V), 2 V, 2.5 V, 5 volts, 6 V, 10 V, etc.).

The ADC 107 can be any type of ADC capable of receiving or selecting one or more signals from the MUX and generating, based at least in part, on the received signal(s) an N-bit digital output code, where N is an integer representing a resolution of the ADC 107. In some scenarios, the ADC 107 is configured to process the one or more signals 121 and generate an N-bit digital output code that can be used to determine whether the circuitry 101 is operating properly. In these scenarios, the ADC 107 communicates its N-bit digital output code to the comparator 115, which can be any type of comparator (e.g., a digital comparator, a digital window comparator, etc.). The comparator 115 compares the N-bit digital output code to a high limit code and a low limit code. If the N-bit digital output code is greater than the high limit code or less than the low limit code, the comparator 115 generates an alert 119 that is provided to the system controller 103. The system controller 103 can process the alert 119 and generate data 123 that is communicated to the circuitry 101. The circuitry 101 can process the data 123 and perform one or more actions based on the results of the processing (e.g., terminate an operation, adjust an operation state or condition, begin an operation, etc.).

In one example of the electronic system 100, a comparator 115 is used, as described above. However, other examples of the electronic system 100 are not so limited. In one example, the example electronic system 100 does not include a comparator 115. Instead, and in this example, the ADC 107's output is communicated to the system controller 103, which processes one or more of the generated N-bit digital output code. For example, the system controller 103 compares the N-bit digital output code to a high limit code and a low limit code. If the N-bit digital output code is greater than the high limit code or less than the low limit code, the system controller 103 generates data 123 that is communicated to the circuitry 101. The circuitry 101 can process the data 123 and perform one or more actions based on the results of the processing (e.g., terminate an operation, adjust an operation state or condition, begin an operation, etc.).

The example ADC IC 105 shown in FIG. 1 includes an integrated self-test mechanism 131 that monitors the ADC 107, the $V_{ref}$ source 109, and the LDO 111 to determine if one or more of these components is operating properly. The integrated self-test mechanism 131 is implemented by the ADC 107 based on signals or data received from the $V_{ref}$ source 109 and the MUX 113. In one scenario, the LDO 111's voltage ($V_{LDO}$) 117 is coupled to the MUX 113. In this scenario, the ADC 107 receives (e.g., selects, etc.) the $V_{LDO}$ 117 from the MUX 113 and generates an N-bit digital output code based, at least in part, on the $V_{LDO}$ 117 and the $V_{Ref}$ 125 that is generated by the $V_{ref}$ source 109. The ADC 107 communicates one or more of the generated N-bit digital output code, the $V_{LDO}$ 117, and the $V_{ref}$ 125 to the comparator 115, which processes one or more of the generated N-bit digital output code, the $V_{ref}$ 125, and the $V_{LDO}$ 117 to assist with determining if the ADC 107, the $V_{ref}$ source 109, and the LDO 111 is malfunctioning or nonoperational.

For one example, the comparator 115 compares the generated N-bit digital output code to a high limit code and a low limit code. If the generated N-bit digital output code is greater than the high limit code or less than the low limit code, the comparator generates an alert 119 that is communicated to the system controller 103 indicating that one or more of the ADC 107, the $V_{ref}$ source 109, and the LDO 111 is malfunctioning or nonoperational. For another example, the comparator 115 compares the $V_{ref}$ 125 received from the ADC 107 and a known appropriate value of the $V_{ref}$ 125. If the $V_{ref}$ 125 received from the ADC 107 differs from the known appropriate value of the $V_{ref}$ 125, the comparator generates an alert 119 that is communicated to the system controller 103 indicating that one or more of the ADC 107 and the $V_{ref}$ source 109 is malfunctioning or nonoperational. For yet another example, the comparator 115 compares the $V_{LDO}$ 117 received from the ADC 107 and a known appropriate value of the $V_{LDO}$ 117. If the $V_{LDO}$ 117 received from the ADC 107 differs from the known appropriate value of the $V_{LDO}$ 117, the comparator generates an alert 119 that is communicated to the system controller 103 indicating that the LDO 111 is malfunctioning or nonoperational. In the scenarios described above, one or more of the known appropriate values of the $V_{LDO}$ 117 and the $V_{ref}$ 125 is stored in memory (not shown) that is associated with the comparator 115, one or more other components of the electronic system 100, or the electronic system itself. For example, one or more of the known appropriate values of the $V_{LDO}$ 117 and the $V_{ref}$ 125 is stored in memory that is coupled to or accessible to the comparator 115.

The system controller 103 may generate data 123 based on the received alert 119 and communicate the data 123 to the circuitry 101. In one scenario, the circuitry 101 may process the data 123 and perform one or more actions based on the results of the processing. For example, the circuitry 101 can determine that one or more of the ADC 107, the $V_{ref}$ source 109, and the LDO 111 is malfunctioning or nonoperational. For a further example, and in response to the circuitry 101's determination, the circuitry 101 can: (i) terminate communications with the ADC IC 105, the system controller 103, and/or one or more other components, device, or systems within or associated with the electronic system 100; (ii) terminate an operation being performed by the circuitry 101; (iii) adjust an operational state or condition of the circuitry 101; or (iv) begin performing an operation. In this further example, the data 123 may indicate, to the circuitry 101, to perform one or more of the operations described in the preceding sentence in response to the circuitry 101's determination.

The example electronic system 100 is not required to include a comparator 115. Instead, and in one example, the ADC 107's output is communicated to the system controller 103, which compares the N-bit digital output code to a high limit code and a low limit code. In this example, if the N-bit digital output code is greater than the high limit code or less than the low limit code, the system controller 103 generates data 123 that is communicated to the circuitry 101. Furthermore, and in this example, the circuitry 101 can process the data 123 and perform one or more actions based on the results of the processing. For example, the circuitry 101 can determine that one or more of the ADC 107, the $V_{ref}$ source 109, and the LDO 111 is malfunctioning or nonoperational. For a further example, and in response to the circuitry 101's determination, the circuitry 101 can: (i) terminate communications with the ADC IC 105, the system controller 103, and/or one or more other components, device, or systems associated with the electronic system 100; (ii) terminate an operation being performed by the circuitry 101; (iii) adjust an operational state or condition of the circuitry 101; or (iv) begin performing an operation. In this further example, the data 123 may indicate, to the circuitry 101, to perform one or more of the operations described in the preceding sentence in response to the circuitry 101's determination.

In one scenario, the N-bit digital output code that is generated based, at least in part, on the $V_{LDO}$ 117 and the $V_{ref}$ 125 is determined using the following equation:

$$\left(\frac{V_{LDO}}{V_{ref}}\right) \times 2^N.$$

The $V_{LDO}$ 117 and the $V_{ref}$ 125 are independent of each other. Also, when each of the ADC 107, the $V_{ref}$ source 109, and the LDO 111 is operating properly, then each of the $V_{LDO}$ 117 and the $V_{ref}$ 125 has a constant magnitude. Consequently, and based on the equation above, the proper N-bit digital output code has a constant value when each of the ADC 107, the $V_{ref}$ source 109, and the LDO 111 is operating properly. Any variation in either the $V_{LDO}$ 117 or the $V_{ref}$ 125 will cause the N-bit digital output code to change. This changed N-bit digital output code indicates that one or more of the ADC 107, the $V_{ref}$ source 109, and the LDO 111 is malfunctioning or nonoperational. To ensure proper functioning of the integrated self-test mechanism 131, the high limit code should be greater than the proper N-bit digital output code and the low high limit code should be less than the proper N-bit digital output code. Consequently, when the ADC 107 communicates an improper N-bit digital output code to the comparator 115, the comparator 115 processes the improper N-bit digital output code and generates an alert 119 that is communicated to the system controller 103, as described above. In configurations of the example electronic system 100 that lack the comparator 115, the system controller 103 processes the N-bit digital output code, as described above.

The comparator 115 is shown as part of the ADC IC 105, however, other examples are not so limited. For example, the comparator 115 can be included as part of the system controller 103. For another example, one or more components, devices, or systems in the electronic system 100 (e.g., ADC IC 105, etc.) lacks a comparator and the system controller 103 performs the operations of the comparator 115 described above. For yet another example, the comparator 115 is a distinct component in the electronic system 100 that is separate from the circuitry 101, the ADC IC 105, and the system controller 103.

In one scenario, the system controller 103 can analyze one or more of the $V_{LDO}$ 117, the $V_{ref}$ 125, and the N-bit digital output code that is generated based, at least in part, on the $V_{LDO}$ 117 or the $V_{ref}$ 125 to determine whether one or more of the ADC 107, the $V_{ref}$ source 109, and the LDO 111 is malfunctioning or nonoperational. The example integrated self-test mechanism 131 shown in FIG. 1 is included in an ADC IC 105 that is separate from the system controller 103. Other examples, however, are not so limited. For example, the ADC 107, the $V_{ref}$ source 109, the LDO 111, the MUX 113, and the comparator 115 can be included in the system controller 103. In this example, there is no need for an ADC IC 105. For another example that lacks the comparator 115, the ADC 107, the $V_{ref}$ source 109, the LDO 111, and the MUX 113 can be included in the system controller 103. In this example as well, there is no need for an ADC IC 105.

Figure 2:
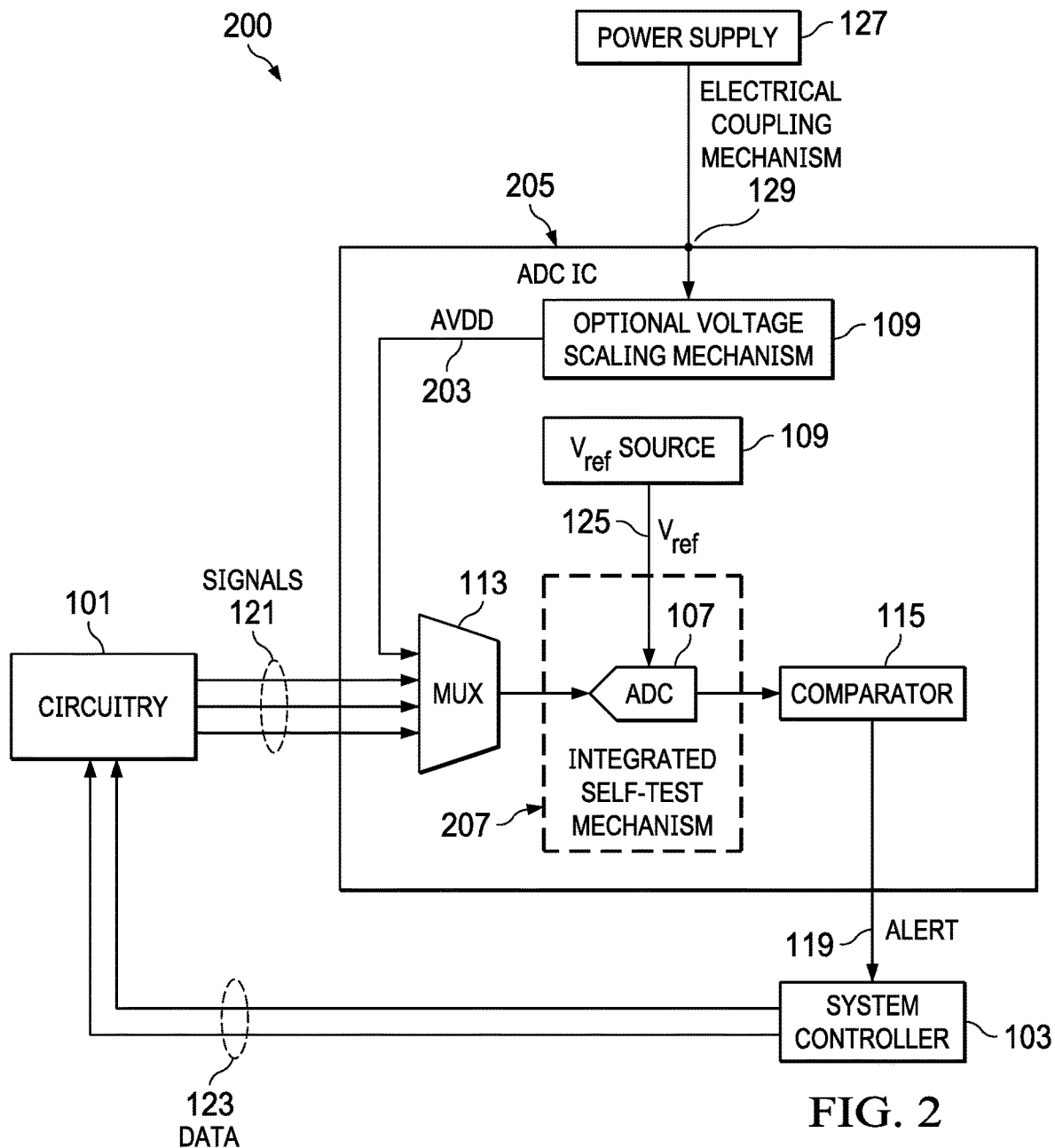
FIG. 2 is an illustration of another example electronic system comprising circuitry to be monitored, an ADC, a $V_{ref}$ source, a power supply, and an integrated self-test mechanism for the ADC, the $V_{ref}$ source, and the power supply.

FIG. 2 is an illustration of an example electronic system 200 comprising circuitry 101 to be monitored, an ADC 107, a $V_{ref}$ source 109, a power supply 127, and an integrated self-test mechanism for the ADC 107, the $V_{ref}$ source 109, and the power supply 127.

The electronic system 200 shown in FIG. 2 includes an ADC IC 205, a system controller 103, circuitry 101 to be monitored, a power supply 127, and an optional voltage scaling mechanism 133. Some or all of the components or circuitry set forth in the electronic system 200 are similar to or the same as some or all of the components or devices set forth in the electronic system 200. For brevity, these components or circuitry are not described again unless such description is necessary to understand the concepts described below in connection with FIG. 2. Furthermore, some or all of the configurations or examples of the electronic system 100 described above in connection with FIG. 1 are applicable to the electronic system 200. For brevity, these configurations or examples are not described again unless such description is necessary to understand the concepts described below in connection with FIG. 2. Moreover, only the differences between the electronic system 100 and the electronic system 200 are described below in connection with FIG. 2 to avoid convoluting the concepts described herein.

One difference between the electronic system 100 and the electronic system 200 is that the electronic system 200 includes an ADC IC 205 instead of the ADC IC 105 described above in connection with FIG. 1. The ADC IC 205 is similar to the ADC IC 105, however, the ADC IC 205 lacks an LDO and includes an optional voltage scaling mechanism 133.

The example ADC IC 205 shown in FIG. 2 includes an integrated self-test mechanism 207 that monitors the ADC 107, the $V_{ref}$ source 109, and the power supply 127 to determine if one or more of these components is operating properly. The integrated self-test mechanism 207 is implemented by the ADC 107 based on signals or data received from the $V_{ref}$ source 109 and the MUX 113. In one scenario, the electrical coupling mechanism 129 communicates the power supply 127's voltage (AVDD) 203 to the MUX 113. In this scenario, the ADC 107 receives (e.g., selects, etc.) the AVDD 203 from the MUX 113 and generates an N-bit digital output code based, at least in part, on the AVDD 203 and the $V_{ref}$ 125 that is generated by the $V_{ref}$ source 109. In one scenario, the ADC 107 communicates one or more of the generated N-bit digital output code, the AVDD 203, and the $V_{ref}$ 125 to the comparator 115, which processes one or more of the generated N-bit digital output code, the AVDD 203, and the $V_{LDO}$ 117 to assist with determining if the ADC 107, the $V_{ref}$ source 109, and the power supply 127 is malfunctioning or nonoperational.

For one example, the comparator 115 compares the generated N-bit digital output code to a high limit code and a low limit code. If the generated N-bit digital output code is greater than the high limit code or less than the low limit code, the comparator generates an alert 119 that is communicated to the system controller 103 indicating that one or more of the ADC 107, the $V_{ref}$ source 109, and the power supply 127 is malfunctioning or nonoperational. For another example, the comparator 115 compares the $V_{ref}$ 125 received from the ADC 107 and a known appropriate value of the $V_{ref}$ 125. If the $V_{ref}$ 125 received from the ADC 107 differs from the known appropriate value of the $V_{ref}$ 125, the comparator generates an alert 119 that is communicated to the system controller 103 indicating that one or more of the ADC 107 and the $V_{ref}$ source 109 is malfunctioning or nonoperational. For yet another example, the comparator 115 compares the AVDD 203 received from the power supply 127 and a known appropriate value of the AVDD 203. If the AVDD 203 received from the power supply 127 differs from the known appropriate value of the AVDD 203, the comparator generates an alert 119 that is communicated to the system controller 103 indicating that power supply 127 is malfunctioning or nonoperational. In the scenarios described above, one or more of the known appropriate values of the AVDD 203 and the $V_{ref}$ 125 is stored in memory (not shown) that associated with the comparator 115, one or more other components of the electronic system 100, or the electronic system itself. For example, one or more of the known appropriate values of the $V_{LDO}$ 117 and the $V_{ref}$ 125 is stored in memory that is coupled to or accessible to the comparator 115.

The system controller 103 may generate data 123 based on the received alert 119 and communicate the data 123 to the circuitry 101. The circuitry 101 may process the data 123 to determine that one or more of the ADC 107, the $V_{ref}$ source 109, and the power supply 127 is malfunctioning or nonoperational Furthermore, the circuitry 101 can process the data 123 and perform one or more actions based on the results of the processing. For example, the circuitry 101 can determine that one or more of the ADC 107, the $V_{ref}$ source 109, and the power supply 127 is malfunctioning or nonoperational. For a further example, and in response to the circuitry 101's determination, the circuitry 101 can: (i) terminate communications with the ADC IC 205, the system controller 103, and/or one or more other components, device, or systems associated with the electronic system 100; (ii) terminate an operation being performed by the circuitry 101; (iii) adjust an operational state or condition of the circuitry 101; or (iv) begin performing an operation. In this further example, the data 123 may indicate, to the circuitry 101, to perform one or more of the operations described in the preceding sentence in response to the circuitry 101's determination.

In one scenario, the N-bit digital output code that is generated based, at least in part, on the AVDD 203 and the $V_{ref}$ 125 is determined using the following equation:

$$\left(\frac{AVDD}{V_{ref}}\right) \times 2^N.$$

The AVDD 203 and the $V_{ref}$ 125 are independent of each other. Also, when each of the power supply 127 and the ADC 107 is operating properly, then each of the AVDD 203 and the $V_{ref}$ 125 has a constant magnitude. Consequently, and based on the equation above, the proper N-bit digital output code has a constant value when each of the power supply 127, the $V_{ref}$ source 109, and the ADC 107 is operating properly. Any variation in either the AVDD 203 or the $V_{ref}$ 125 will cause the N-bit digital output code to change. This changed N-bit digital output code indicates that one or more of the power supply 127, the $V_{ref}$ source 109, and the ADC 107 is malfunctioning or nonoperational. To ensure proper functioning of the integrated self-test mechanism 207, the high limit code should be greater than the proper N-bit digital output code and the low high limit code should be less than the proper N-bit digital output code. Consequently, when the ADC 107 communicates an improper N-bit digital output code to the comparator 115, the comparator 115 will generate an alert 119 that is communicated to the system controller 103.

In one scenario, the system controller 103 can analyze one or more of the AVDD 203, the $V_{ref}$ 125, and the N-bit digital output code that is generated based, at least in part, on the AVDD 203 or the $V_{ref}$ 125 to determine whether one or more of the power supply 127, the $V_{ref}$ source 109, and the ADC 107 is malfunctioning or nonoperational. The example integrated self-test mechanism 207 shown in FIG. 2 is included in an ADC IC 205 that is separate from the system controller 103. Other examples, however, are not so limited. For example, the ADC 107, the $V_{ref}$ source 109, the electrical coupling mechanism 129, the MUX 113, and the comparator 115 can be included in the system controller 103. In this example, there is no need for an ADC IC 205.

The voltage scaling mechanism 133 described herein in connection with FIG. 2 is optional. That is, some configurations will include the optional voltage scaling mechanism 133, while other configurations will not. For one example, the optional voltage scaling mechanism 133 is configured to scale (e.g., attenuate, etc.) the AVDD 203 generated by the power supply 127 in response to the optional voltage scaling mechanism 133 determining that the AVDD 203 generated by the power supply 127 is larger than an input range associated with the ADC 107. In some scenarios, voltage scaling can be based, at least in part, on one or more voltage scaling factors. In one scenario, the AVDD 203 is generated by the power supply 127 is provided "as is" to the ADC IC 205 via the electrical coupling mechanism 129. Consequently, and for this scenario, the AVDD 203 is not scaled (e.g., attenuated, etc.) until after the AVDD 203 that is generated by the power supply 127 is provided to the ADC IC 205. Thus, in one example, the AVDD 203 that is provided to the MUX 113 is a scaled AVDD (e.g., an attenuated AVDD, etc.). In this example, the integrated self-test mechanism 207 uses the scaled AVDD 203 to monitor the power supply 127 and generate the N-bit digital output code. The optional voltage scaling mechanism 133 can be: (i) a voltage scaling system; (ii) any suitable device, component, or system capable of scaling the AVDD 203; or (iii) any combination thereof. An example of an input range associated with the ADC 107 is a range of voltages that can be applied (e.g., safely applied, etc.) to the one or more of: (i) the ADC IC 105; and (ii) one or more components associated with or in the ADC IC 105 (e.g., the ADC 107, etc.). The range of voltages can be a predetermined range of voltages. In one scenario, the predetermined range of voltages is dictated by one or more of design considerations and design constraints.

Figure 3:
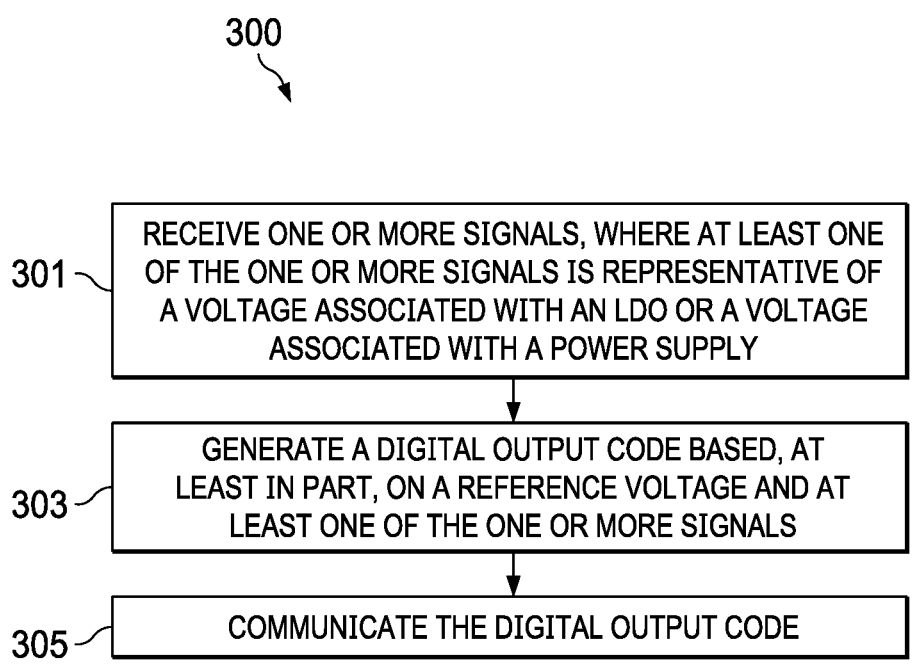
FIG. 3 is flowchart illustrating a method of generating a digital output code that can be used to monitor an operational state of an ADC, a $V_{ref}$ source, an LDO, or a power supply.

FIG. 3 is flowchart illustrating a method 300 that includes monitoring one or more of an ADC, a $V_{ref}$ source, an LDO, and a power supply and generating a digital output code that can be used to determine whether one or more of the ADC, the $V_{ref}$ source, the LDO, and the power supply is operating properly. The method 300 can be performed by an ADC (e.g., the ADC 107 in FIG. 1, the ADC 107 in FIG. 2, etc.).

The method begins at operation 301, where an ADC receives (e.g., selects, etc.) one or more signals (e.g., one or more analog signals, etc.) from a MUX. In one example, the ADC receives the one or more signals in accordance with the descriptions provided above in connection with FIG. 1 or FIG. 2. The one or more signals may comprise a signal that is representative of a voltage associated with an LDO or a power supply. This signal is described above in connection with FIG. 1 or FIG. 2.

Next, the method 300 proceeds to operation 303. Here, the ADC generates a digital output code (e.g., an N-bit digital output code, etc.) based, at least in part, on the one or more signals and a $V_{ref}$ associated with the ADC. Examples of the appropriate digital output code are provided above in the descriptions provided above in connection with FIG. 1 or FIG. 2. The $V_{ref}$ associated with the ADC can be similar to or the same as the $V_{ref}$ described above in connection with FIG. 1 or FIG. 2. The $V_{ref}$ can be generated by a $V_{ref}$ source (e.g., the $V_{ref}$ source 109 in FIG. 1, the $V_{ref}$ source 109 in FIG. 2, etc.).

The method 300 moves on to operation 305. Here, the ADC communicates the digital output code to a comparator or a system controller for processing. In one example, the comparator or the system controller analyzes the digital output code to determine whether the ADC, the $V_{ref}$ source, the LDO, or the power supply is malfunctioning or nonoperational. In another example, the comparator or the system controller analyzes the digital output code and one or more of the $V_{ref}$ and the voltage associated with the LDO or the power supply to determine whether the ADC, the $V_{ref}$ source, the LDO, or the power supply is malfunctioning or nonoperational. One or more actions can be performed in response to the determination. Examples of such actions are described above in connection with FIG. 1 or FIG. 2.

In the foregoing description, the phrases "at least one of A or B," "at least one of A and B," "one or more of A and B," "A or B," "A and/or B," and "A and B" are intended to mean A only, B only, or A and B.

Furthermore, numerous specific details have been omitted to avoid obscuring the examples set forth herein.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

In addition, the term "couple" also covers wires, leads, pads, pins, any combination thereof, or any suitable coupling mechanism or combination of suitable coupling mechanisms capable of coupling two or more devices, components, or systems. One example of a coupling mechanism is an electrical coupling mechanism.

Modifications are possible in the described examples, and other examples are possible, within the scope of the claims.

What is claimed is:

1. An integrated circuit (IC), comprising:
   an analog-to-digital converter (ADC) configured to generate an N-bit digital output code based, at least in part, on one or more analog signals, wherein N is an integer and wherein N represents a resolution of the ADC;
   a reference voltage ($V_{ref}$) source coupled to the ADC, the $V_{ref}$ source configured to generate a $V_{ref}$ for the ADC;
   a multiplexer (MUX) coupled to the ADC, the MUX configured to communicate one or more first analog signals to the ADC; and
   a low-dropout regulator (LDO) coupled to the ADC and the MUX, the LDO configured to communicate a second analog signal that is representative of a voltage associated with the LDO ($V_{LDO}$) to the MUX;
   wherein the ADC is further configured to:
   receive the one or more first analog signals and the second analog signal from the MUX; and
   generate the N-bit digital output code based, at least in part, on two or more selected from a group consisting of:
   the one or more first analog signals;
   the second analog signal; and
   the $V_{ref}$.

2. The IC of claim 1, wherein the N-bit digital output code is represented as:

$$\left(\frac{V_{LDO}}{V_{ref}}\right) \times 2^N.$$

3. The IC of claim 1, wherein the N-digital output code is to assist with or enable determining whether one or more of the ADC, the $V_{ref}$ source, and the LDO is malfunctioning or nonoperational.

4. An integrated circuit (IC), comprising:
   an analog-to-digital converter (ADC) configured to generate an N-bit digital output code based, at least in part, on one or more analog signals, wherein N is an integer and wherein N represents a resolution of the ADC;
   a reference voltage ($V_{ref}$) source coupled to the ADC and configured to generate a $V_{ref}$ for the ADC;
   a multiplexer (MUX) coupled to the ADC, the MUX configured to communicate one or more first analog signals to the ADC;
   a low-dropout regulator (LDO) coupled to the ADC and the MUX, the LDO configured to communicate a second analog signal that is representative of a voltage associated with the LDO ($V_{LDO}$) to the MUX; and a comparator coupled to the ADC, the comparator configured to compare the N-bit digital output code to one or more additional digital output codes to assist with or enable determining whether one or more of the ADC, the $V_{ref}$ source, or the LDO is malfunctioning or non-operational;

wherein the ADC is further configured to:

receive the one or more first analog signals and the second analog signal from the MUX; and generate the N-bit digital output code based, at least in part, on two or more selected from a group consisting of:
the one or more first analog signals;
the second analog signal; and
the $V_{ref}$.

5. The IC of claim 4, wherein the N-bit digital output code is represented as:

$$\left(\frac{V_{LDO}}{V_{ref}}\right) \times 2^N.$$

6. An integrated circuit (IC), comprising:

an analog-to-digital converter (ADC) configured to generate an N-bit digital output code based, at least in part, on one or more analog signals, wherein N is an integer and wherein N represents a resolution of the ADC;

a reference voltage ($V_{ref}$) source coupled to the ADC, the $V_{ref}$ source configured to generate a $V_{ref}$ for the ADC;

a multiplexer (MUX) coupled to the ADC, the MUX configured to communicate one or more first analog signals to the ADC; and an electrical coupling mechanism coupled to the ADC and the MUX, the electrical coupling mechanism configured to couple with a power supply and to communicate a second analog signal that is representative of a voltage (AVDD) associated with the power supply to the MUX;

wherein the ADC is further configured to:

receive the one or more first analog signals and the second analog signal from the MUX; and generate the N-bit digital output code based, at least in part, on two or more selected from a group consisting of:
the one or more first analog signals;
the second analog signal; and
the $V_{ref}$.

7. An integrated circuit (IC), comprising:

an analog-to-digital converter (ADC) configured to generate an N-bit digital output code based, at least in part, on one or more analog signals, wherein N is an integer and wherein N represents a resolution of the ADC;

a reference voltage ($V_{ref}$) source coupled to the ADC, the $V_{ref}$ source configured to generate a $V_{ref}$ for the ADC;

a multiplexer (MUX) coupled to the ADC, the MUX configured to communicate one or more first analog signals to the ADC; and an electrical coupling mechanism coupled to the ADC and the MUX, the electrical coupling mechanism configured to couple with a power supply and to communicate a second analog signal that is representative of a voltage (AVDD) associated with the power supply to the MUX;

further comprising:

a voltage scaling mechanism coupled to the electrical coupling mechanism and the MUX, the voltage scaling mechanism configured to:
determine that the second analog signal that is representative of the AVDD is greater than a predetermined range of voltages that can be applied to the IC; and
scale the second analog signal, wherein the scaled second analog signal is received by the MUX.

* * * * *